(12) United States Patent
Saint-Erne et al.

(10) Patent No.: US 11,784,613 B2
(45) Date of Patent: Oct. 10, 2023

(54) HIGH OUTPUT POWER DENSITY RADIO FREQUENCY TRANSISTOR AMPLIFIERS IN FLAT NO-LEAD OVERMOLD PACKAGES

(71) Applicant: Wolfspeed, Inc., Durham, NC (US)

(72) Inventors: Phil Saint-Erne, Phoenix, AZ (US); William Pribble, Durham, NC (US); Warren Brakensiek, Phoenix, AZ (US); Bradley Millon, Durham, NC (US)

(73) Assignee: Wolfspeed, Inc., Durham, NC (US)

( * ) Notice: Subject to any disclaimer, the term of this patent is extended or adjusted under 35 U.S.C. 154(b) by 298 days.

(21) Appl. No.: 17/213,895

(22) Filed: Mar. 26, 2021

(65) Prior Publication Data

US 2022/0311392 A1 Sep. 29, 2022

(51) Int. Cl.
*H03F 3/187* (2006.01)
*H03F 3/193* (2006.01)
*H03F 3/195* (2006.01)
*H01L 23/31* (2006.01)
*H01L 23/66* (2006.01)
*H03F 3/213* (2006.01)
*H01L 29/20* (2006.01)

(52) U.S. Cl.
CPC .............. *H03F 3/193* (2013.01); *H01L 23/31* (2013.01); *H01L 23/66* (2013.01); *H03F 3/195* (2013.01); *H03F 3/213* (2013.01); *H01L 29/2003* (2013.01)

(58) Field of Classification Search
CPC .............. H03F 3/187; H03F 1/07; H03F 1/02
USPC .............................................. 330/307, 124 R
See application file for complete search history.

(56) References Cited

U.S. PATENT DOCUMENTS 8,354,888 B2 * 1/2013 Matsuzuka ............... H03F 3/60 330/296
9,337,774 B2 * 5/2016 Szymanowski ....... H01L 23/645
10,510,694 B2 * 12/2019 Benson ................... H01L 23/66

* cited by examiner

*Primary Examiner* — Henry Choe
(74) *Attorney, Agent, or Firm* — Myers Bigel, P.A.

(57) ABSTRACT

Packaged RF transistor amplifiers are provided that include a flat no-lead overmold package that includes a die pad, a plurality of terminal pads and an overmold encapsulation that at least partially covers the die pad and the terminal pads and an RF transistor amplifier die mounted on the die pad and at least partially covered by the overmold encapsulation. These packaged RF transistor amplifiers may have an output power density of at least 3.0 W/mm².

22 Claims, 7 Drawing Sheets

HIGH OUTPUT POWER DENSITY RADIO FREQUENCY TRANSISTOR AMPLIFIERS IN FLAT NO-LEAD OVERMOLD PACKAGES

FIELD

The present invention relates to microelectronic devices and, more particularly, to packaged radio frequency ("RF") transistor amplifiers.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz), among others, have become more prevalent. In particular, there is now high demand for RF transistor amplifiers that are used to amplify RF signals at frequencies of, for example, 500 MHz and higher (including microwave frequencies). These RF transistor amplifiers often need to exhibit high reliability, good linearity and handle high output power levels.

RF transistor amplifiers may be implemented in silicon or wide bandgap semiconductor materials, such as silicon carbide ("SiC") and Group III nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

SUMMARY

Pursuant to embodiments of the present invention, RF transistor amplifiers are provided that comprise a flat no-lead overmold package that includes a die pad, a plurality of terminal pads and an overmold encapsulation that at least partially covers the die pad and the terminal pads and an RF transistor amplifier die mounted on the die pad and at least partially covered by the overmold encapsulation. An output power density rating of the packaged RF transistor amplifier is at least 3.0 W/mm$^2$.

In some embodiments, the output power density rating of the packaged RF transistor amplifier is at least 3.5 W/mm$^2$, 4.0 W/mm$^2$, at least 4.5 W/mm$^2$, 5.0 W/mm$^2$, or 5.5 W/mm$^2$. In some embodiments, the output power density rating of the packaged RF transistor amplifier is between 3.0 W/mm$^2$ and 5.5 W/mm$^2$, between 3.5 W/mm$^2$ and 5.5 W/mm$^2$, between 5.0 W/mm$^2$ and 5.5 W/mm$^2$, or between 4.0 W/mm$^2$ and 5.0 W/mm$^2$. In some embodiments, an operating frequency of the packaged RF transistor amplifier is greater than 2.5 GHz or is between 3.1-4.2 GHz, 3.1-3.7 GHz or between 3.1-3.5 GHz.

In some embodiments, the RF transistor amplifier die is a monolithic microwave integrated circuit ("MMIC") RF transistor amplifier die. In some embodiments, the MMIC RF transistor amplifier die includes a first stage RF transistor amplifier and a second stage RF transistor amplifier that are electrically connected in series. In some embodiments, the MMIC RF transistor amplifier die further includes an input matching network that is coupled between an RF input of the MMIC RF transistor amplifier die and the first stage RF transistor amplifier, an interstage matching network that is coupled between the first stage RF transistor amplifier and the second stage RF transistor amplifier, and/or an output matching network that is coupled between the second stage RF transistor amplifier and an output of the MMIC RF transistor amplifier die.

In some embodiments, a gate-drain-gate spacing of at least one RF transistor amplifier included in the MMIC RF transistor amplifier die is less than 45 microns.

In some embodiments, the flat no-lead package is a quad flat no-lead package.

In some embodiments, the overmold encapsulation comprises a thermoset plastic overmold encapsulation.

In some embodiments, a surface area of a bottom surface of the packaged RF transistor amplifier is between 49 mm$^2$ and 81 mm$^2$.

In some embodiments, the RF transistor amplifier is provided in combination with a printed circuit board that includes a die attach pad and a plurality of landing pads. In such embodiments, the die pad may be attached to the die attach pad and the terminal pads may be attached to respective ones of the landing pads. In some embodiments, the printed circuit board further includes an array of conductive vias that are underneath the die attach pad.

In some embodiments, the output power density rating of between 3.5 W/mm$^2$ and 5.0 W/mm$^2$ is achieved with the RF transistor amplifier operating at a duty cycle of at least 15% or at a duty cycle of between 10% and 50%. In some embodiments, the output power density rating of between 3.5 W/mm$^2$ and 5.0 W/mm$^2$ is achieved with the RF transistor amplifier operating at a pulse width of between 100 and 500 microseconds.

Pursuant to further embodiments of the present invention, packaged RF transistor amplifiers are provided that comprise a flat no-lead package that includes a die pad, a plurality of terminal pads and an overmold encapsulation that at least partially covers the die pad and the terminal pads and a MMIC RF transistor amplifier die mounted on the die pad and at least partially covered by the overmold encapsulation. A surface area of the flat no lead package is less than 80 mm$^2$ and an output power of the packaged RF transistor amplifier is at least 200 Watts.

In some embodiments, the MMIC RF transistor amplifier die is configured to amplify RF signals having frequencies greater than 2.5 GHz, or frequencies between 3.1-4.2 GHz or frequencies between 3.1-3.5 GHz.

In some embodiments, the output power of the packaged RF transistor amplifier is between 250 and 350 Watts.

In some embodiments, the MMIC RF transistor amplifier die includes a first stage RF transistor amplifier and a second stage RF transistor amplifier that are electrically connected in series. In some embodiments, the MMIC RF transistor amplifier die further includes an input matching network that is coupled between an RF input of the MMIC RF transistor amplifier die and the first stage RF transistor amplifier, an interstage matching network that is coupled between the first stage RF transistor amplifier and the second stage RF transistor amplifier, and an output matching network that is coupled between the second stage RF transistor amplifier and an output of the MMIC RF transistor amplifier die.

In some embodiments, a gate-drain-gate spacing of at least one RF transistor amplifier included in the MMIC RF transistor amplifier die is less than 45 microns.

In some embodiments, the flat no-lead package is a quad flat no-lead package.

In some embodiments, the overmold encapsulation comprises a thermoset plastic overmold encapsulation.

In some embodiments, the RF transistor amplifier is provided in combination with a printed circuit board that includes a die attach pad and a plurality of landing pads, where the die pad is attached to the die attach pad and the terminal pads are attached to respective ones of the landing pads. In some embodiments, the printed circuit board may further include an array of conductive vias that are underneath the die attach pad.

In some embodiments, the output power density rating of between 3.5 W/mm$^2$ and 5.0 W/mm$^2$ is achieved with the RF transistor amplifier operating at a duty cycle of at least 15% or at a duty cycle of between 10% and 50%. In some embodiments, the output power density rating of between 3.5 W/mm$^2$ and 5.0 W/mm$^2$ is achieved with the RF transistor amplifier operating at a pulse width of between 100 and 500 microseconds.

Pursuant to still further embodiments of the present invention, packaged RF transistor amplifiers are provided that comprise a flat no-lead package that includes a die pad, a plurality of terminal pads and an overmold encapsulation that at least partially covers the die pad and the terminal pads and an RF transistor amplifier die mounted on the die pad. An upper surface and side surfaces of the RF transistor amplifier die are covered by the overmold encapsulation. The RF transistor amplifier die includes at least one RF transistor amplifier circuit having a gate-drain-gate spacing of less than 45 microns. An output power density rating of the packaged RF transistor amplifier is at least 3.5 W/mm$^2$.

In some embodiments, an operating frequency of the packaged RF transistor amplifier is greater than 2.5 GHz and/or the output power density rating of the packaged RF transistor amplifier is between 3.5 W/mm$^2$ and 5.0 W/mm$^2$.

In some embodiments, the RF transistor amplifier die includes a first stage RF transistor amplifier and a second stage RF transistor amplifier that are electrically connected in series.

In some embodiments, the RF transistor amplifier die further includes an input matching network that is coupled between an RF input of the RF transistor amplifier die and the first stage RF transistor amplifier, an interstage matching network that is coupled between the first stage RF transistor amplifier and the second stage RF transistor amplifier, and an output matching network that is coupled between the second stage RF transistor amplifier and an output of the RF transistor amplifier die.

In some embodiments, a gate-drain-gate spacing of at least one RF transistor amplifier included in the RF transistor amplifier die is less than 45 microns.

In some embodiments, a surface area of a bottom surface of the packaged RF transistor amplifier is between 49 mm$^2$ and 81 mm$^2$.

In some embodiments, the RF transistor amplifier is provided in combination with a printed circuit board that includes a die attach pad and a plurality of landing pads, wherein the die pad is attached to the die attach pad and the terminal pads are attached to respective ones of the landing pads. In some embodiments, the printed circuit board may further include an array of conductive vias that are underneath the die attach pad In some embodiments, the output power density rating of between 3.5 W/mm$^2$ and 5.0 W/mm$^2$ is achieved with the RF transistor amplifier operating at a duty cycle of at least 15% or at a duty cycle of between 10% and 50%. In some embodiments, the output power density rating of between 3.5 W/mm$^2$ and 5.0 W/mm$^2$ is achieved with the RF transistor amplifier operating at a pulse width of between 100 and 500 microseconds.

BRIEF DESCRIPTION OF THE DRAWINGS

FIG. 4A illustrates the metallization that is on the top surface of the semiconductor layer structure and only depicts a few of the unit cell transistors.

DETAILED DESCRIPTION

Figure 1A:
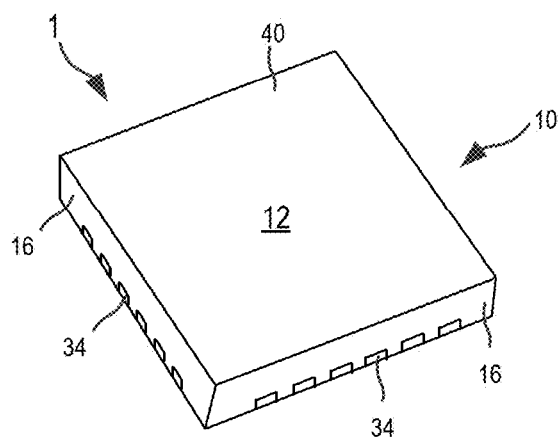
FIG. 1A is a schematic top perspective view of a conventional RF transistor amplifier packaged in a quad flat no-lead package.

Many modern RF transistor amplifiers operate at high power levels, such as output power levels of hundreds of watts. The high current levels flowing through the RF transistor amplifier circuits included in these RF transistor amplifiers may generate significant amounts of heat. Unfortunately, the performance of the RF transistor amplifier circuits may deteriorate if the internal temperature of the device exceeds certain levels. Thus, dissipating the heat generated by the RF transistor amplifier circuits may be an important consideration in the design of a packaged RF transistor amplifier.

RF transistor amplifiers that are packaged in air cavity ceramic packages are widely available. Air cavity ceramic packages may be very efficient in venting heat away from the RF transistor amplifier circuits and these devices may exhibit very good RF performance. However, the air cavity ceramic packages may be relatively large and expensive to manufacture, and hence may not be suitable for many applications due to cost or size concerns.

RF transistor amplifiers are also available that are packaged in overmold packages such as plastic overmold packages. A wide variety of overmold packages are available. Overmold packages are formed by mounting the RF transistor amplifier die on a lead frame or other submount using, for example, a die attach material. Bond wires (or other electrical connections) are made between terminals on the RF transistor amplifier die and other structures such as leads of the lead frame. A plastic polymer or other compound may then be injection molded to surround the RF transistor amplifier die and at least a portion of the submount. The plastic polymer is injection molded so that the leads are exposed (e.g., they are not completely covered by the plastic overmold and/or they extend out of the overmold package). Overmold packages are typically smaller than ceramic air-cavity packages, and may be cheaper to manufacture. However, the maximum temperature rating of most conventional overmold packaging technologies is rather low (e.g., 150-250° C.), and hence overmold packaging technologies have traditionally only been used with RF transistor amplifiers that operate at lower output power levels. The low dielectric constant of the overmold material may also negatively impact the RF performance of the transistor amplifier, particularly with respect to RF transistor amplifiers that are designed to operate in higher frequency bands (e.g., frequencies above about 2.5 GHz). As such, overmold packaging technologies generally are not used for high power RF transistor amplifiers that operate in frequency bands such as, for example, the C-band frequency band (typically defined as 3.1-4.2 GHz or a portion thereof) or higher frequency bands. This is particularly true in applications where it is necessary to keep the overall size of the package small, as devices with small package requirements have a reduced ability to spread out heat generating elements (e.g., the RF transistor amplifier circuits and/or the unit cell transistors thereof) and/or may have smaller, and hence less effective, heat dissipation structures.

One known category of overmold package is the so-called "flat no-lead" overmold package. The two most common types of flat no-lead overmold packages are the quad flat no-lead overmold package and the dual flat no-lead overmold package. Each of these packages are leadframe based plastic overmold packages. The difference between the two are that quad flat no-lead overmold packages have "terminal pads" on all four sides of a die pad included in the package, whereas dual flat no-lead overmold packages only have terminal pads on two sides of the die pad. Flat no-lead overmold packages do not have traditional "leads" that extend beyond the edge of the overmold encapsulation for connection to external circuits, but instead have a plurality of metal pads that are exposed on a bottom surface of the package. The metal pads include the die pad, which is a large metal pad that is typically in the center of the bottom surface of the package, and a plurality of smaller "terminal pads" that are formed on one or more sides of the die pad. A packaged RF transistor amplifier implemented in a flat no-lead overmold package is typically mounted on a printed circuit board (or equivalent structure). The die pad and terminal pads of the flat no lead overmold package may be soldered or otherwise connected to a corresponding die attach pad and corresponding landing pads, respectively, on the printed circuit board. Electrical signals such as an RF input signal, an RF output signal and direct current ("DC") bias voltages may be input to the printed circuit board and supplied to (or output from) the RF transistor amplifier die through the die pad/die attach pad and the terminal pads/landing pads.

Figure 1B:
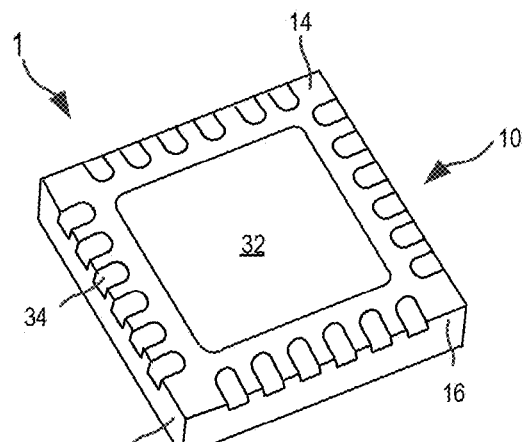
FIG. 1B is a schematic bottom perspective view of the conventional packaged RF transistor amplifier of FIG. 1A.
Figure 1C:
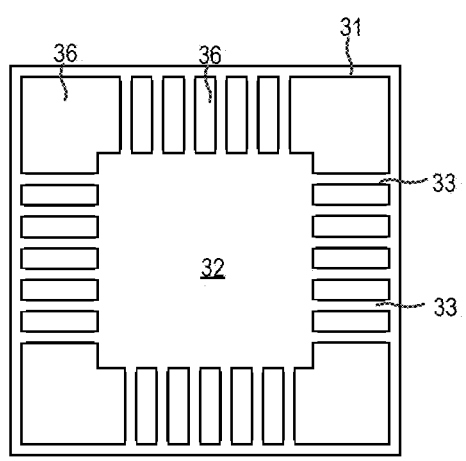
FIG. 1C is a plan view of a leadframe (before terminal pad separation) that is used to manufacture the conventional packaged RF transistor amplifier of FIGS. 1A-1B.

FIGS. 1A and 1B are schematic top and bottom perspective views, respectively, of a conventional RF transistor amplifier 1 that is packaged in a quad flat no-lead overmold package. The packaged RF transistor amplifier 1 includes a semiconductor die (not visible) that is packaged within the overmold-based package 10. As shown in FIGS. 1A-1B, the package 10 has a top surface 12, a bottom surface 14 and a plurality of sidewalls 16. The surface areas of the top and bottom surfaces 12, 14 may be significantly larger than the surface area of each sidewall 16. At least the bottom surface 14 may be a substantially flat surface to facilitate mounting the packaged RF transistor amplifier 1 on a printed circuit board (not shown). The top surface 12 is also typically a flat surface. The package 10 may comprise at least a lead frame 30 and an overmold encapsulation 40. As shown in FIG. 1C, the lead frame 30 may comprise a metal frame 31 that has a plurality of holes 36 punched therein to define a die pad 32 and a plurality of leads 33 that extend from one or more sides of the die pad 32. The die pad 32 and the leads 33 may comprise a monolithic structure and may be mounted on an adhesive tape (not shown). A second punching (or equivalent) operation may be performed to remove the portion of each lead 33 that connects to the die pad 32 in order to convert the leads 33 into respective terminal pads 34 (FIGS. 1A-1B) that are physically separated and electrically isolated from the die pad 32. FIG. 1B illustrates the form of the leadframe 30 after the punching operation is completed so that the terminal pads 34 are spaced-apart from the die pad 32.

The semiconductor die (not visible) is mounted on the upper surface of the die pad 32 (e.g., via a die attach material such as a solder). Bond wires (not shown) are then soldered or otherwise mounted to extend between various of the terminal pads 34 and terminals (e.g., metal pads) on the upper side of the semiconductor die. Once the bond wires have been installed to provide the electrical connections between the terminal pads 34 and the semiconductor die, the overmold encapsulation 40 is injection molded to cover the semiconductor die and upper surfaces of the die pad 32 and the terminal pads 34. The overmold encapsulation 40 may comprise, for example, a plastic polymer compound. The adhesive tape may maintain the die pad 32 and the terminal pads 34 in their respective positions during the injection molding operation used to encapsulate the semiconductor die and lead frame 30, and the adhesive tape may thereafter be removed.

As shown in FIG. 1A, the overmold encapsulation 40 may form the top surface 12 of the packaged RF transistor amplifier 1 and at least the majority of each sidewall 16 of the packaged RF transistor amplifier 1. A distal end of each terminal pad 34 extends to the periphery of the package 10 and hence is visible in FIG. 1A at the lower portion of each sidewall 16. In some flat no-lead overmold packages, the distal ends of the terminal pads 34 are inset with respect to the sidewalls 16 of the package 10 such that the terminal pads 34 are not visible (i.e., each sidewall 16 is formed solely of overmold encapsulation 40).

As shown in FIG. 1B, the bottom surface of the die pad 32 is exposed on the bottom surface of packaged RF transistor amplifier 1, as are the bottom surfaces of the terminal pads 34. The overmold encapsulation 40 may be coplanar with the bottom surfaces of the die pad 32 and terminal pads 34, or may be slightly recessed so that the bottom surfaces of the die pad 32 and terminal pads 34 extend farther downwardly than does the bottom surface of the overmold encapsulation 40.

Flat no-lead overmold packages are also sometimes referred to as micro leadframe ("MLF") packages or small-outline no-lead ("SON") packages. Flat no-lead overmold packages are surface mount technologies that can be used to connect semiconductor integrated circuit chips to printed circuit boards without any need for mounting leads of a package in through holes in the printed circuit board. Flat no-lead overmold packages may allow for nearly chip scale packaging, as the surface area of the die pad 32 (and hence the semiconductor die) may be nearly as large as the surface area of a major surface of the package 10. Flat no-lead overmold packages may have very thin profiles, and may have very low weights. They may also have relatively low inductance connections between the semiconductor die and the printed circuit board, which may improve performance in some applications. Additionally, the exposed metal pad connections provide good thermal and electrical performance. However, as discussed above, flat no-lead packages are generally not suitable for high power, high frequency applications.

Pursuant to embodiments of the present invention, packaged RF transistor amplifiers are provided that have output power density ratings that exceed 3.0 W/mm$^2$, 3.5 W/mm$^2$, 4.0 W/mm$^2$, 4.5 W/mm$^2$, 5.0 W/mm$^2$ or even 5.5 W/mm$^2$ that are packaged in flat no-lead overmold packages. Herein, an "output power density rating" of an RF transistor amplifier refers to the output power density that the device may achieve and maintain under normal operating conditions at room temperature operation. These RF transistor amplifiers may include, for example, a monolithic microwave integrated circuit ("MMIC") that includes a single or multistage transistor amplifier and one or more matching circuits that are implemented on a single semiconductor die. The packaged RF transistor amplifiers according to embodiments of the present invention may operate at high frequencies and may support very large output power densities in a near chip scale overmold package.

As discussed above, flat no-lead overmold packages such as quad flat no-lead packages have not been used in high power, high frequency applications. Pursuant to embodiments of the present invention, techniques are provided for providing RF transistor amplifiers that are packaged in quad flat no-lead (or other flat no-lead) overmold packages that may operate at high output power levels (e.g., 150-300 Watts or more output power) and/or at high frequencies (e.g., frequencies above 2.5 GHz such as, for example, frequencies within the 3.1-4.2 GHz C-band frequency range). The packaged RF transistor amplifiers according to embodiments of the present invention may have output power density ratings that exceed 3.0 W/mm$^2$, 3.5 W/mm$^2$ or 4.0 W/mm$^2$, 4.5 W/mm$^2$, 5.0 W/mm$^2$ or even 5.5 W/mm$^2$ and may be small, lightweight, and relatively inexpensive to manufacture.

In one embodiment, an RF transistor amplifier that is suitable for radar applications is provided in an 8 mm×8 mm quad flat no-lead overmold package that has an output power (at room temperature) of 250 Watts (54 dBm) for input powers of 29 dBm or more across the 3.1-3.5 GHz frequency range with a pulse width of 300 microseconds at a 20% duty cycle. The droop over the 300 microsecond pulse is about 0.7 dB, and the RF transistor amplifier does not exhibit either odd mode or even mode instabilities. The flat no-lead overmold packaged RF transistor amplifiers according to embodiments of the present invention may be mounted on a printed circuit board or similar structure for connection to external circuits. The printed circuit board may include a dense array of conductive vias that are positioned underneath the die pad of the flat no-lead overmold package to provide enhanced thermal dissipation and a source connection to electrical ground. The design of the active area of the semiconductor die may be modified to increase heat dissipation from within the semiconductor die.

Conventionally, one technique for reducing heat build-up within a packaged RF transistor amplifier is to increase the overall size or "footprint" of the device. This spreads out the heat generating elements within the device, thereby reducing the temperature at local hot-spots (e.g., at the locations of the RF transistor amplifier circuits), and also allows for larger heat sinks for venting heat from the package. However, it has been discovered that when this conventional approach is applied to flat no-lead overmold packages operating at high output power levels, the increase in the sizes of the semiconductor die and package may have negative effects. For example, as the size of the package is increased, the metal layers of the semiconductor die may become more prone to delaminate from the semiconductor layer structure. Such delamination destroys the device. This tendency to delaminate occurs because the overmold encapsulation material may be "sticky" and hence may strongly adhere to the semiconductor die. The overmold material will typically have a coefficient of thermal expansion that is very different from the coefficient of thermal expansion of the metal and semiconductor layers within the semiconductor die. Due to the difference in the rates of expansion and contraction of the overmold encapsulation and the semiconductor, as the device heats up during operation and cools down when turned off, forces may be exerted on the semiconductor die that can result in delamination of the metal layers. The larger the semiconductor die size, the more prone the semiconductor die may be to such delamination when the device is operated at high output power levels. As another example, the overmold material may introduce parasitic effects that can negatively impact RF performance, and the more overmold material used, the more this effect may be seen.

In order to address these issues, the packaged RF transistor amplifiers according to some embodiments of the present invention may have relatively small semiconductor die, which tends to increase the temperature. The smaller die size may be achieved by non-intuitively designing the unit cell transistors to have increased cell density (e.g., the distance between the gate and drain regions of the unit cell transistors may be reduced), resulting in increased heat generation in localized regions of the device. Additional passivation layers may be added to the device structure between the metal layers and the overmold encapsulation that may absorb some of the strains/stresses during cool down in order to prevent delamination. Additionally, other aspects of the semiconductor die and the RF printed circuit board design may be changed to reduce heat generation and to increase heat transfer away from the semiconductor die.

In some embodiments, packaged RF transistor amplifiers are provided that include a flat no-lead overmold package that includes a die pad, a plurality of terminal pads and an overmold encapsulation that at least partially covers the die pad and the terminal pads and an RF transistor amplifier die mounted on the die pad and at least partially covered by the overmold encapsulation. In some embodiments, these packaged RF transistor amplifiers may have an output power density rating of at least 3.0 W/mm². In other embodiments, a surface area of the flat no lead package may be less than 80 mm² and an output power density rating of the MMIC RF transistor amplifier is at least 200 Watts. In still other embodiments, the RF transistor amplifier die may include at least one RF transistor amplifier circuit having a gate-drain-gate spacing of less than 45 microns, and an output power density rating of the RF transistor amplifier is at least 3.5 W/mm².

In some embodiments, output power density rating of the RF transistor amplifier may be at least 4.0 W/mm², or may be between 3.0 W/mm² and 5.5 W/mm², between 3.5 W/mm² and 5.5 W/mm², between 4.0 W/mm² and 5.5 W/mm², between 3.5 W/mm² and 5.0 W/mm², or between 4.0 W/mm² and 5.0 W/mm². These output power density ratings may be achieved at room temperature (25° C.) operation. In each of the above cases, the RF transistor amplifier may operate at a duty cycle of at least 15%, at least 20%, at least 25% or at least 30%. In some embodiments, the duty cycle may be between 10% and 50% or between 15% and 30% or between 15% and 25%. The pulse width may be between 100 and 500 microseconds on example embodiments, or between 200 and 400 microseconds. Herein the "output power density" refers to the output power (in Watts) divided by the area of the bottom surface of the packaged RF transistor amplifier. In some embodiments, an operating frequency of the packaged RF transistor amplifier is greater than 2.5 GHz or greater than 3.0 GHz. In other embodiments, the operating frequency of the packaged RF transistor amplifier is greater than 3.1 GHz. In still other embodiments, the operating frequency of the packaged RF transistor amplifier may be at least one of the 2.5-2.7 GHz, 3.1-4.2 GHz or 5.1-5.8 GHz frequency bands, or sub-portions thereof.

In some embodiments, the RF transistor amplifier die may be a MMIC RF transistor amplifier die. The MMIC RF transistor amplifier die may include a first stage RF transistor amplifier and a second stage RF transistor amplifier that are electrically connected in series. The MMIC RF transistor amplifier die may further include one or more of an input matching network that is coupled between an RF input of the MMIC RF transistor amplifier die and the first stage RF transistor amplifier, an interstage matching network that is coupled between the first stage RF transistor amplifier and the second stage RF transistor amplifier, and an output matching network that is coupled between the second stage RF transistor amplifier and an output of the MMIC RF transistor amplifier die.

In some embodiments, a surface area of a bottom surface of the packaged RF transistor amplifier may be between 49 mm² and 81 mm². In some embodiments, the output power density of the MMIC RF transistor amplifier is between 250 and 350 Watts.

In some embodiments, the RF transistor amplifier may be provided in combination with a printed circuit board that includes a die attach pad and a plurality of landing pads, wherein the die pad is attached to the die attach pad and the terminal pads are attached to respective ones of the landing pads. The printed circuit board may also include an array of conductive vias that are formed underneath the die attach pad.

Embodiments of the present invention will now be discussed in greater detail with reference to FIGS. 2A-7B.

Figure 2A:
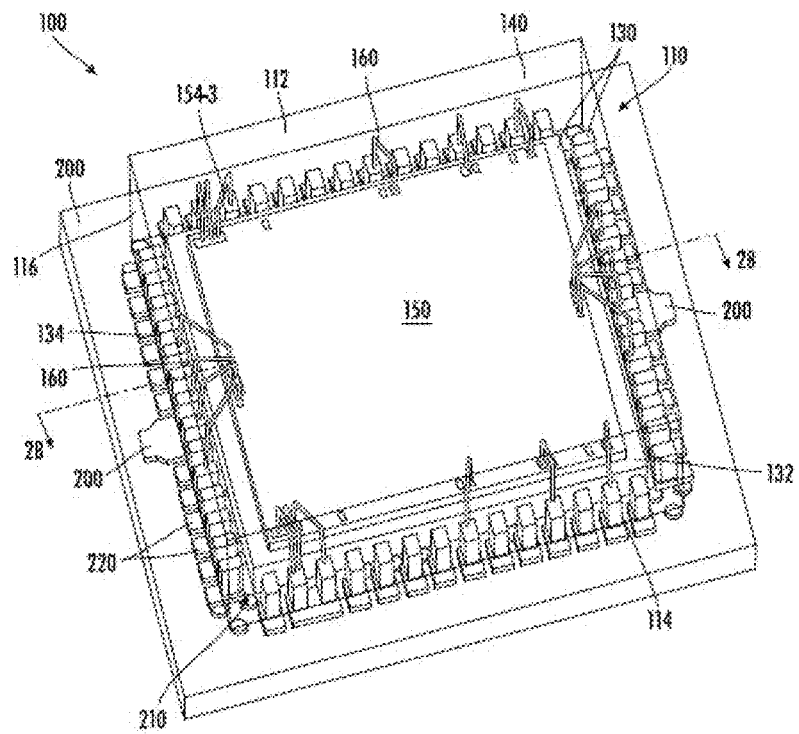
FIG. 2A is a schematic shadow top perspective view of a packaged RF transistor amplifier according to embodiments of the present invention mounted on an RF printed circuit board.
Figure 2B:
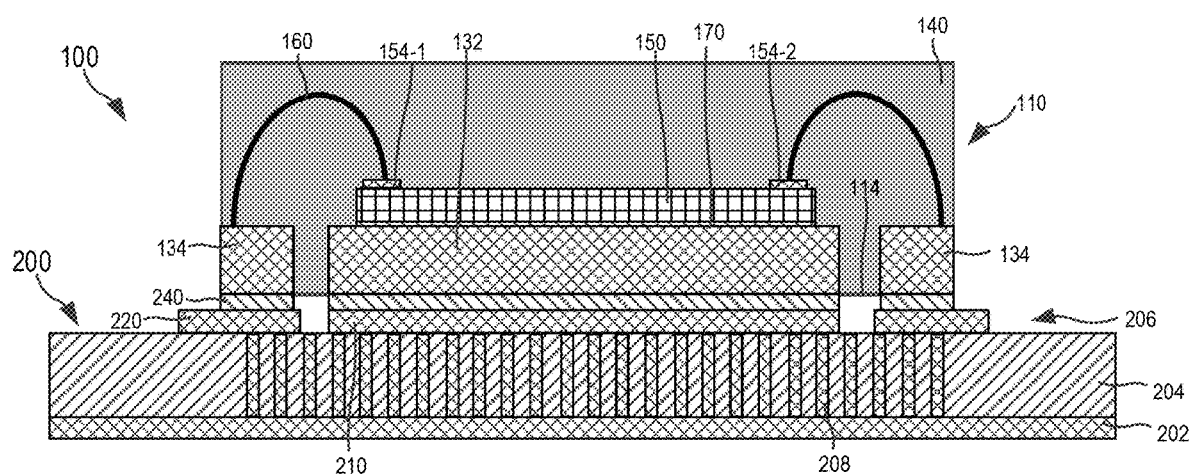
FIG. 2B is a schematic cross-sectional view taken along line 2B-2B of FIG. 2A.

FIG. 2A is a schematic shadow top perspective view of a packaged RF transistor amplifier 100 according to certain embodiments of the present invention mounted on an RF printed circuit board 200. FIG. 2B is a cross-sectional view that is taken along line 2B-2B of FIG. 2A. As shown in FIGS. 2A-2B, the packaged RF transistor amplifier 100 is mounted on a printed circuit board 200 which includes electrical connections to external circuits. The printed circuit board 200 may comprise, for example, an evaluation board or a customer printed circuit board on which the packaged RF transistor amplifier 100 is mounted.

As shown in FIG. 2A, the packaged RF transistor amplifier 100 includes a package 110 that has a top surface 112, a bottom surface 114 and a plurality of sidewalls 116. The surface areas of the top and bottom surfaces 112, 114 are significantly larger than the surface area of each sidewall 116. The top and bottom surfaces 112, 114 are substantially flat surfaces. Having a substantially flat bottom surface 114 facilitates mounting the packaged RF transistor amplifier 100 on the printed circuit board 200 so that metal pads (discussed below) on the bottom surface of the packaged RF transistor amplifier 100 can be soldered to mating metal pads on the printed circuit board 200.

The package 110 may comprise at least a lead frame 130 and an overmold encapsulation 140. The leadframe 130 frame includes a die pad 132 and a plurality of terminal pads 134 that extend from all four sides of the die pad 132. The lead frame 130 may originally have the design of the lead frame 30 of FIG. 1C, discussed above, with the number of leads and the size of the die pad adjusted as appropriate based on the size of the semiconductor die included in the device 100 and the number of electrical connections needed to the printed circuit board 200. The leadframe 130 may then be punched to separate the leads from the die pad 132 in order to form the terminal pads 134 shown in FIGS. 2A-2B that are physically separated and electrically isolated from the die pad 132. While FIGS. 2A-2B illustrate a device that uses a quad no-lead overmold package 110, it will be appreciated that any appropriate flat no-lead overmold package may be used. For example, in some embodiments, a dual flat no-lead overmold package may be used in place of the quad flat no-lead overmold package 110. As additional examples, the flat no-lead overmold package 110 may be formed using either punch or saw singulation, and/or the terminal pads 134 may or may not extend to the perimeter of the package 110 so that they form a portion of the sidewalls 116 (i.e., the terminal pads 134 may or may not be exposed along the sidewalls 116).

A semiconductor die 150 is mounted on the die pad 132. The semiconductor die 150 may be mounted on the die pad 132 using any suitable die attach technique. For example, the semiconductor die 150 may be mounted on the die pad 132 using a sintered silver die attach material or another suitable die attach material 170. The semiconductor die 150 may comprise an RF transistor amplifier die. In some embodiments, the semiconductor die 150 may comprise a MMIC RF transistor amplifier die that includes one or more transistor amplifiers as well as one or more matching networks. Example semiconductor die designs will be discussed in more detail below with reference to FIGS. 3A-4C. The semiconductor die 150 may include one or more terminals 154 on the top surface thereof. The terminals 154 may include, for example, an RF input terminal 154-1 that is connected to a gate structure of an RF transistor amplifier included in the semiconductor die 150, an RF output terminal 154-2 that is connected to a drain structure of an RF transistor amplifier included in the semiconductor die 150, and a plurality of DC bias terminals 154-3.

Bond wires 160 are then soldered or otherwise mounted to extend between various of the terminal pads 134 and the terminals 154 on the upper side of the semiconductor die 150. Once the bond wires 160 have been installed to provide the electrical connections between the terminal pads 134 and the terminals 154 on the semiconductor die 150, the overmold encapsulation 140 is injection molded to cover the top and side surfaces of the semiconductor die 150 and the and upper surfaces of the die pad 132 and the terminal pads 134. The overmold encapsulation 140 may comprise, for example, a plastic polymer compound. In some embodiments, the overmold encapsulation may comprise a thermoset plastic overmold. The overmold encapsulation 140 may form at least a portion of the sidewalls 116 of the packaged device 100. The terminal pads 134 may or may not be exposed through the overmold encapsulation 140 along the sidewalls 116. The overmold encapsulation 140 is shown in "shadow" view in FIG. 2A in order to illustrate the structures covered by the overmold encapsulation 140.

While the bottom surface 114 of the packaged RF transistor amplifier 100 is not visible in FIGS. 2A-2B, it will be understood that it may be identical to the bottom surface 14 of the packaged RF transistor amplifier 1 shown in FIG. 1B, with the number of terminal pads and the size of the die pad adjusted to match that which is shown in FIG. 2A. Thus, it will be understood that the bottom surface of the die pad 132 and the bottom surfaces of the terminal pads 134 are exposed on the bottom surface 112 of packaged RF transistor amplifier 100. The overmold encapsulation 140 may be coplanar with the bottom surfaces of the die pad 132 and terminal pads 134, or may be slightly recessed so that the bottom surfaces of the die pad 132 and terminal pads 134 extend farther downwardly than does the bottom surface of the overmold encapsulation.

The printed circuit board 200 may comprise, for example, a standard RF printed circuit board. The printed circuit board 200 includes a die attach pad 210 (barely visible in FIG. 2A) and a plurality of "landing pads" 220. The die attach pad 210 may be a metal (e.g., copper) pad on an upper surface of the printed circuit board 200 that is sized to be at least as large as the die pad 132 to facilitate soldering or otherwise attaching the die pad 132 of packaged RF transistor amplifier 100 to the die attach pad 210. The die attach pad 210 may provide an electrical connection between the semiconductor die 150 and the printed circuit board 200. For example, the source terminal of the RF transistor amplifiers included in semiconductor die 150 may be located on the bottom side of the semiconductor die 150, and may be electrically connected to, for example, a ground voltage through the die pad 132 and the die attach pad 210.

The landing pads 220 may comprise smaller metal pads on the upper surface of the printed circuit board 200 that surround the die attach pad 210. The number and positions of the landing pads 220 may be arranged so that a landing pad 220 is located underneath each terminal pad 134 when the packaged RF transistor amplifier 100 is mounted on the printed circuit board 200.

Referring to FIG. 2B, the cross-sectional view reveals the "stack-up" of layers present when the packaged RF transistor amplifier 100 is mounted on printed circuit board 200. As shown, the printed circuit board 200 includes a dielectric substrate 204 that has metal (e.g., copper) patterns 202, 206 formed on the bottom and top sides thereof, respectively. The dielectric substrate may be a dielectric material suitable for use in RF circuits. An array of conductive vias 208 are formed through the dielectric substrate 204 that may electrically connect the bottom and top metal patterns 202, 206. The conductive vias 208 may comprise, for example, copper-plated vias, copper-filled vias, or vias filled with a conductive epoxy resin. The conductive vias 208 may provide a primary thermal interface for venting heat from the packaged RF transistor amplifier 100. In other embodiments, the die attach pad 210 and conductive vias 208 may be replaced with a metal slug that is inserted into or otherwise formed in an opening in the printed circuit board 200.

The bottom metal pattern 202 may comprise, for example, a metal ground layer 202 that covers a substantial portion of the bottom surface of the dielectric substrate 204 and that is connected to a ground voltage. The ground layer 202 may provide a ground signal to the die attach pad 210 (e.g., through the conductive vias 208) and may also serve as a ground layer for microstrip transmission lines that may be formed in the printed circuit board 200 (e.g., for coupling RF input and output signals to and from packaged RF transistor amplifier 100). The top metal pattern 206 may comprise a metal pattern that forms the die attach pad 210, the landing pads 220 and the above-referenced microstrip transmission lines. The conductive vias 208 may be positioned directly underneath the die attach pad 210.

As is further shown in FIG. 2B, the packaged RF transistor amplifier 100 may be mounted on the printed circuit board 200 using a package attach material 240 to physically bond and electrically connect the die pad 132 to the die attach pad 210 and to physically bond and electrically connect the terminal pads 134 to the respective landing pads 220. As discussed above, the die pad 132 and the terminal pads 134 comprise the lead frame 130 of packaged RF transistor amplifier 100. The package attach material 240 may comprise, for example, a solder such as a tin-based solder.

The semiconductor die 150 is mounted on the die pad 132 via the die attach material 170. The overmold encapsulation 140 surrounds the upper and side surfaces of the semiconductor die 150 and the die pad 132, as well as at least the upper surfaces of the terminal pads 134. Electrical signals such as an RF input signal, an RF output signal and direct current bias voltages may be input to the printed circuit board 200 and supplied to (or output from) the semiconductor die 150 through the die pad 132 and the terminal pads 134.

Figure 3:
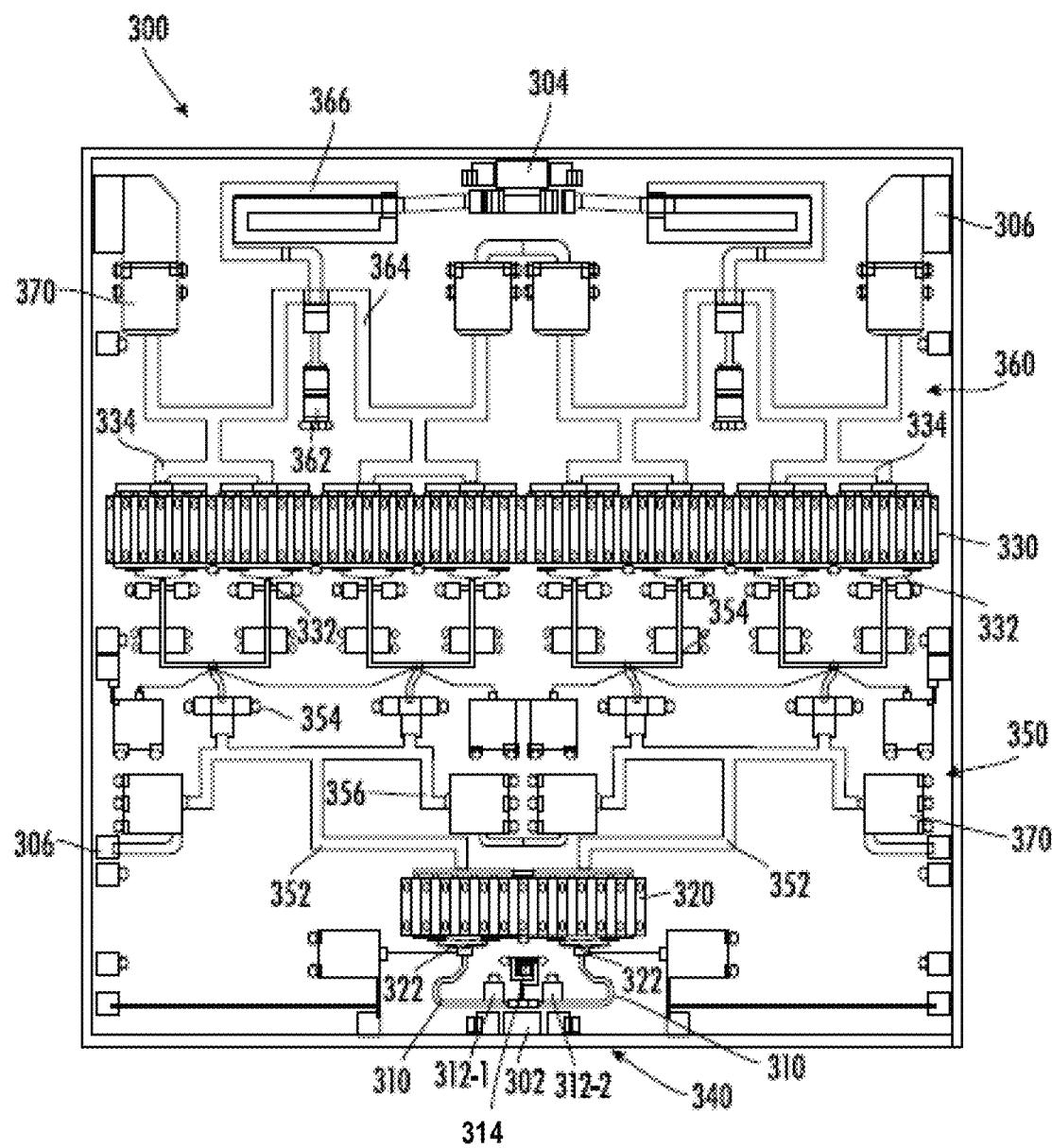
FIG. 3 is a plan view of a semiconductor die that may be included in the packaged RF transistor amplifier of FIGS. 2A-2B.

FIG. 3 is a plan view of a semiconductor die 300 that may be used to implement the semiconductor die 150 included in the packaged RF amplifier of FIGS. 2A-2B. In the depicted embodiment, the semiconductor die 300 is a monolithic microwave integrated circuit ("MMIC"). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate.

RF transistor amplifiers are typically implemented in a "unit cell" configuration in which a large number of individual unit cell transistors are arranged electrically in parallel. RF transistor amplifiers may include one or more amplification stages, with each stage typically implemented as a transistor amplifier. An RF transistor amplifier may be implemented as a single RF transistor amplifier circuit, or may include a plurality of RF transistor amplifier circuits. When multiple RF transistor amplifier die are used, they may be electrically connected in series and/or in parallel.

In the embodiment depicted in FIG. 3, the semiconductor die 300 comprises a MMIC RF amplifier die 300 that includes an RF input pad 302, an RF output pad 304, and a plurality of DC bias input pads 306. The RF input pad 302 may be connected to one or more of the terminal pads 134 using bond wires 160. Likewise, the RF output pad 304 and each of the DC bias input pads 306 may be connected to additional ones of the terminal pads 134 using bond wires 160. These bond wire connections are illustrated in FIGS. 2A-2B.

The MMIC RF amplifier die 300 includes both a first stage RF pre-amplifier 320 and a second stage RF main amplifier 330 that are electrically connected in series. The MMIC RF amplifier die also includes an input matching network 340, an interstage matching network 350, and an output matching network 360. Each of the matching networks 340, 350, 360 may comprise an impedance matching circuit, a harmonic termination matching circuit, or both. As known in the art, an impedance matching circuit refers to an electrical circuit that is designed to improve the impedance match between two components in order to reduce reflections of the input signal and hence improve the return loss performance of the device. Thus, the input matching network may include an impedance matching component that is configured to improve the impedance match between the input transmission lines on the printed circuit board 200 and the first stage RF pre-amplifier 320 for RF signals at the fundamental operating frequency of the amplifier. The interstage matching network 350 may similarly be configured to improve the impedance match between the output of the first stage RF pre-amplifier 320 and the input of the second stage RF main amplifier 330 for RF signals at the fundamental operating frequency. The output matching network 360 may be configured to improve the impedance match between the output of the second stage RF main amplifier 330 and the output transmission line on the printed circuit board 200 connected thereto for RF signals at the fundamental operating frequency. One or more of the matching networks 340, 350, 360 may alternatively or additionally include harmonic termination circuits that are designed to, for example, at least partly terminate to ground harmonics of the fundamental RF signal that may be generated during device operation, such as second and third order harmonics.

Figure 4A:
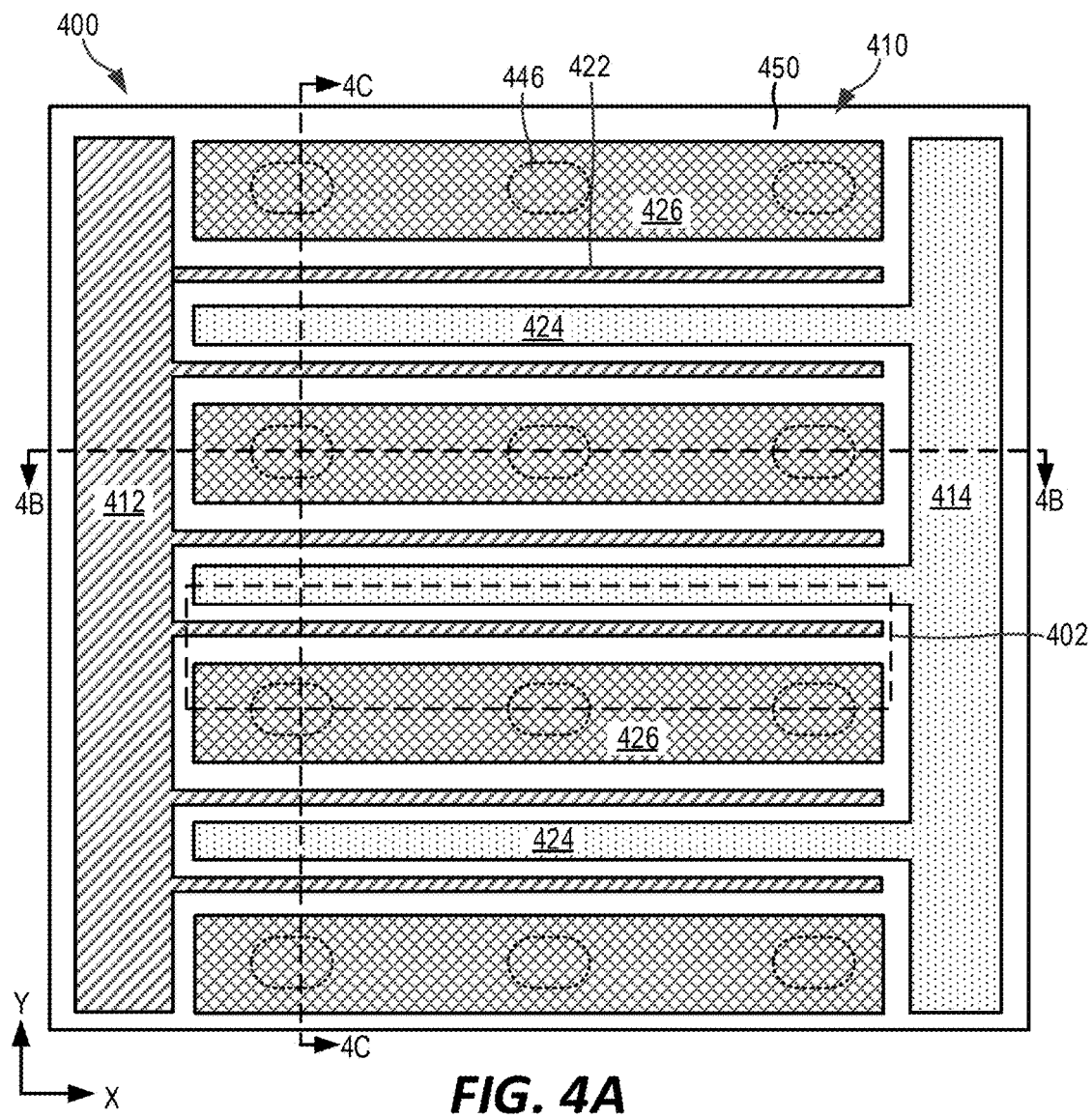
FIG. 4A is a schematic plan view of a Group III nitride-based RF transistor amplifier circuit that may be used to implement the pre-amplifier and/or the main amplifier in the semiconductor die of FIG. 3.
Figure 4B:
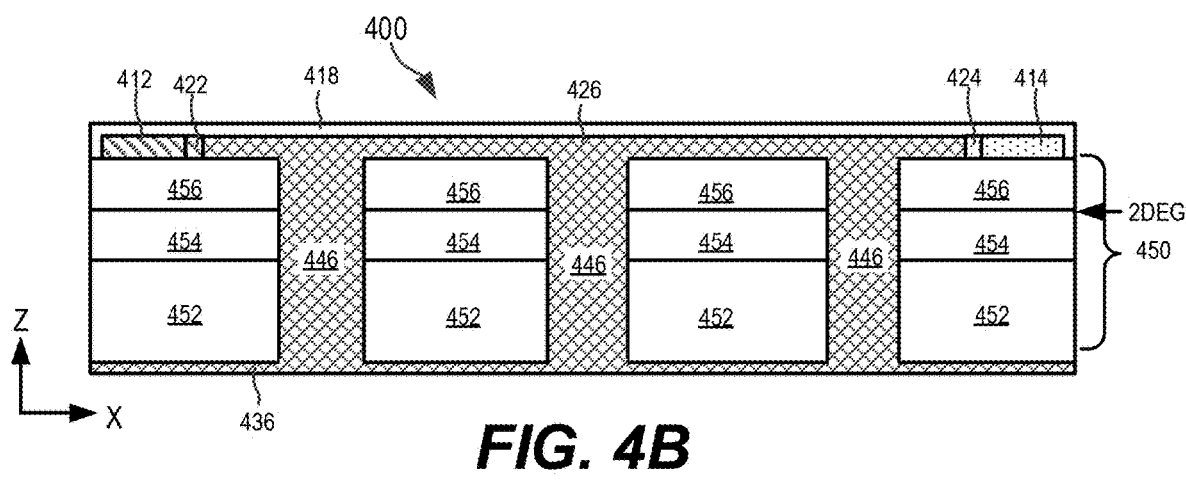
FIGS. 4B and 4C are schematic cross-sectional views taken along lines 4B-4B and 4C-4C, respectively, of FIG. 4A.
Figure 4C:
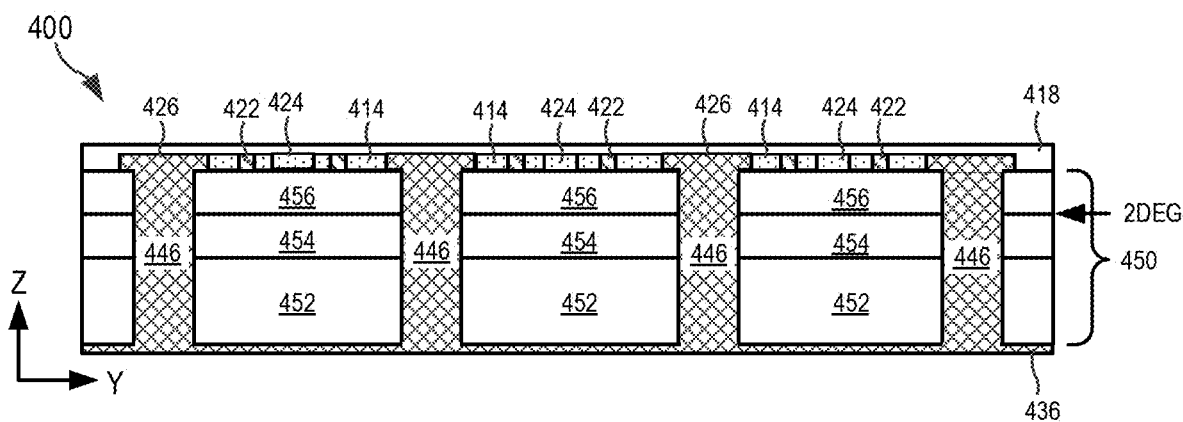

The first stage RF pre-amplifier 320 and the second stage main amplifier 330 may each comprise, for example, a Group III nitride-based high electron mobility transistor (HEMT) amplifier. FIGS. 4A through 4C are various views that schematically illustrate a portion of a Group III nitride-based RF transistor amplifier 400 that may be used to implement either or both the first stage RF pre-amplifier 320 and the second stage main amplifier 330. In particular, FIG. 4A is a schematic plan view of the RF transistor amplifier 400. In FIG. 4A, some of the metallization that is on the top surface of the semiconductor layer structure has been removed to illustrate the metallization that directly contacts the semiconductor layer structure of the RF transistor amplifier 400. FIGS. 4B and 4C are schematic cross-sectional views of the RF transistor amplifier 400 taken along lines 4B-4B and 4C-4C of FIG. 4A, respectively. It will be appreciated that FIGS. 4A-4C (and many of the other figures of the present application) are highly simplified diagrams, and that actual RF transistor amplifiers may include many more unit cells and various circuitry and elements that are not shown in the simplified figures herein.

As shown in FIG. 4A, the RF transistor amplifier 400 includes a gate bus 412 and a drain bus 414, a plurality of gate fingers 422, a plurality of drain fingers 424 and a plurality of source fingers 426, all of which are formed on an upper surface of a semiconductor layer structure 450. The gate fingers 422, drain fingers 424 and source fingers 426 may extend in parallel to each other, with the gate fingers 422 extending from the gate bus 412 in a first direction and the drain fingers 424 extending from the drain bus 414 in a direction opposite the first direction. Each gate finger 422 may be positioned between a drain finger 414 and a source finger 426.

The gate bus 412 and the gate fingers 422 may be implemented as a first monolithic metal pattern, and may form all or part of a gate electrode structure of the RF transistor amplifier 400. The drain bus 414 and the drain fingers 424 may be implemented as a second monolithic metal pattern, and may form all or part of a drain electrode of the RF transistor amplifier 400.

The source fingers 426 may include a metal, and may be physically and electrically connected to a source terminal of the RF transistor amplifier 400. The source terminal may be located on the bottom side of the semiconductor layer structure 450 and may be physically and electrically connected to the source fingers 426 through by a plurality of metal-plated (or metal-filled) source vias 446 that extend through the semiconductor layer structure 450. One or more interlayer insulating layers 418 (see FIGS. 4B-4C) are formed that isolate the gate metallization 412, 422, the drain metallization 414, 424 and the source metallization 426 from each other. The interlayer insulating layer(s) 418 may include a dielectric material, such as SiN, $SiO_2$, etc.

The RF transistor amplifier 400 includes a plurality of unit cell transistors 402, one of which is indicated in the dashed box in FIG. 4A. The unit cell transistor 402 includes a gate finger 422, a portion of a drain finger 424 and a portion of a source finger 426 along with the portions of the semiconductor layer structure 450 underlying the identified gate finger 422, drain finger 424 and source finger 426. Since all of the gate fingers 422 are electrically connected to a common gate bus 412, all of the drain fingers 424 are electrically connected to a common drain bus 414, and all of the source fingers 426 are electrically connected to a common source terminal, it can be seen that the unit cell transistors 402 are all electrically connected together in parallel.

FIGS. 4B and 4C illustrate the semiconductor layer structure 450 in more detail. As shown in FIGS. 4B and 4C, the semiconductor layer structure 450 includes a plurality of semiconductor layers. In the depicted embodiment, these semiconductor layers include a channel layer 454 and a barrier layer 456 that is on a top side of the channel layer 454. The semiconductor layer structure 450 will typically include additional semiconductor and/or non-semiconductor layers. For example, the semiconductor layer structure 450 may include a growth substrate 452 on which the other semiconductor layers are grown. The growth substrate 452 may comprise, for example, a 4H-SiC or 6H-SiC substrate. The growth substrate 452, even if formed of a non-semiconductor material, is considered to be part of the semiconductor layer structure 450. Optional buffer, nucleation, transition, strain balancing and/or other layers (not shown) may also be provided within the semiconductor layer structure 450.

In some embodiments, the channel layer 454 is a Group III nitride material, such as $Al_xGa_{1-x}N$ where $0 \leq x < 1$, provided that the energy of the conduction band edge of the channel layer 454 is less than the energy of the conduction band edge of the barrier layer 456 at the interface between the channel and barrier layers 454, 456. The channel layer 454 may also be other Group III nitrides such as InGaN, AlInGaN or the like. The channel layer 454 may be undoped or unintentionally doped and may be grown to a thickness of, for example, greater than about 20 Å. The channel layer 454 may also be a multi-layer structure, such as a superlattice or combinations of GaN, AlGaN or the like. The channel layer 454 may have a bandgap that is less than the bandgap of at least a portion of the barrier layer 456, and the channel layer 454 may also have a larger electron affinity than the barrier layer 456.

The barrier layer 456 may include AlGaN, AlInGaN and/or AlN or combinations of layers thereof. The barrier layer 456 may, for example, be from about 0.1 nm to about 30 nm or more thick. In certain embodiments, the barrier layer 456 is undoped or doped with an n-type dopant to a concentration less than about $10^{19}$ cm$^{-3}$. In some embodiments, the barrier layer 456 is $Al_xGa_{1-x}N$ where $0<x<1$ (e.g., x=0.2-0.4). The barrier layer 456 may be thick enough and may have a high enough Al composition and doping to induce a significant carrier concentration at the interface between the channel layer 454 and the barrier layer 456.

Due to the difference in bandgap between the barrier layer 456 and the channel layer 454 and piezoelectric effects at the interface between the barrier layer 456 and the channel layer 454, a two-dimensional electron gas (2DEG) is induced in the channel layer 454 at a junction between the channel layer 454 and the barrier layer 456 when a sufficient bias voltage is applied to the gate electrode structure. The 2DEG acts as a highly conductive layer that allows conduction between the source region of each unit cell transistor 402 and its associated drain region, where the source region is the portion of the semiconductor layer structure 450 that is directly underneath the source finger 426 and the drain region is the portion of the semiconductor layer structure 450 that is directly underneath the corresponding drain finger 424.

Referring again to FIG. 3, the first stage RF pre-amplifier 320 includes a total of twenty-four gate fingers 422. Each gate finger 422 has a length of about 0.4 mm, and the total gate periphery (i.e., the length of each gate finger 422 multiplied by the number of gate fingers 422) is about 9.6 mm. The second stage RF main amplifier 330 includes a total of ninety-six gate fingers 422. Each gate finger 422 again has a length of about 0.5 mm, and the total gate periphery is about 48 mm. The total die size is about 6.4 mm×6.4 mm. The target bias conditions are 50 Volts and 500-600 mA.

Still referring to FIG. 3, it can be seen that the RF input pad 302 is coupled to the first stage RF pre-amplifier 320 via a pair of metal traces 310. Input RF signals are divided into two sub-components that are carried by the respective metal traces 310, and each metal trace 310 feeds the sub-component of the RF signal carried thereon to a respective input 322 to the first stage RF pre-amplifier 320. A first pair of capacitors 312-1, 312-2, a spiral inductor 314 and the bond wires 160 connecting the terminal pads 134 to the RF input pad 302 form the input matching circuit 340. Each half of the first stage RF pre-amplifier 320 has a respective output that connects to a respective input 352 to the interstage impedance matching circuit 350. The interstage impedance matching circuit 350 includes a plurality of capacitors 354 and inductive trace sections 356 that are configured to improve the impedance match between the outputs of the first stage RF pre-amplifier 320 and the inputs 332 to the second stage RF main amplifier 330. The interstage impedance matching circuit 350 also includes a corporate feed network component that splits each of the outputs of the first stage RF pre-amplifier 320 four ways so that the two outputs of the first stage RF pre-amplifier 320 can feed the eight inputs 332 to the second stage RF main amplifier 330.

The second stage RF main amplifier 330 has a total of eight outputs 334 that connect to the output impedance matching circuit 360. The output impedance match matching circuit 360 includes capacitors 362, inductive trace segments 364 and spiral inductors 366 that are configured to improve the impedance match between the outputs 334 of the second stage RF main amplifier 330 and an output transmission line on printed circuit board 200. The semiconductor die 300 also includes a plurality of DC block capacitors 370 that aid in matching to a desired output impedance and eliminate the need for a bias-T circuit.

The package 110 (FIGS. 2A-2B) is an 8 mm×8 mm quad flat no-lead overmold package. Thus, the sidewalls of the semiconductor die 150/300 are each less than a millimeter away from the corresponding sidewalls 116 of the package 110, providing a near chip scale packaged device. As can be seen in FIG. 3, the second stage main amplifier 330 extends across the full length of the semiconductor die 300. In order to fit all ninety-six unit cell transistors 402 in this space, the gate-drain-gate spacing in each unit cell 402 (i.e., the center-to-center distance between two adjacent gate fingers) was reduced from standard dimensions to 45 microns. This change increases the amount of heat generated in the area of the second stage RF main amplifier 330, and thus is non-intuitive, as flat no-lead overmold packages are not designed for high temperature operations.

One of the problems caused by excessive heat build-up within the package during device operation is that the efficiency of one or both of the RF transistor amplifier stages may be reduced. In order to counteract any such reduction in efficiency, the input and output matching circuits 340, 360 were designed to narrow the range of the impedance match at the fundamental frequency, which improves the termination of the second harmonic. The improved termination of the second harmonic improves the efficiency of the amplifier, and hence increases the output power in the operating frequency band.

Figure 5:
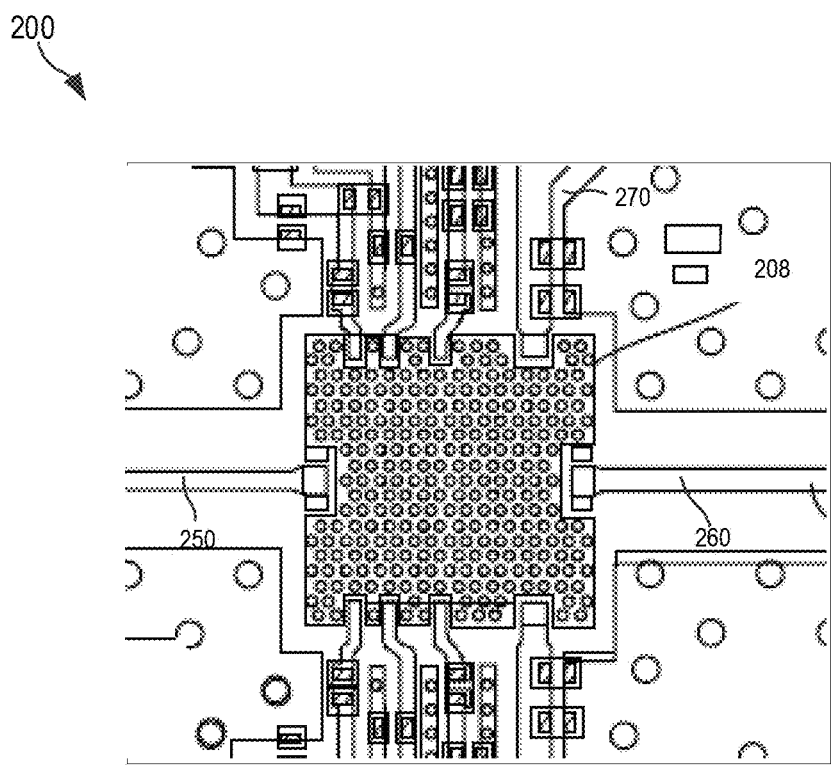
FIG. 5 is a schematic plan view of a portion of an RF printed circuit board on which the packaged RF transistor amplifiers according to certain embodiments of the present invention can be mounted.

FIG. 5 is a schematic plan view of a portion of the RF printed circuit board 200 that provides additional detail regarding the design of the printed circuit board 200. As shown in FIG. 5, the RF board 200 includes a conductive via array 208. The conductive via array 208 may comprise a plurality of metal-plated and/or metal-filled vias that extend through the dielectric substrate 204 of the RF printed circuit board 200. In other embodiments, non-metal materials may be used to plate or fill the vias, such as electrically and/or thermally conductive epoxy resins. The conductive vias 208 may be arranged in a dense array in order to enhance thermal transfer from the packaged RF transistor amplifier 100 to a heat sink (not shown) that may be mounted on the opposite side of the RF printed circuit board 200 underneath the array of conductive vias 208.

As is further shown in FIG. 5, a trace of an input RF transmission line 250 is provided in the upper metal layer 206 that is used to couple RF signals from an external source (not shown) to the landing pads 220 that are coupled (by bond wires 160) to the RF input terminal 154-1 of the semiconductor die 150. Similarly, a trace of an output RF transmission line 260 is provided in the upper metal layer 206 that is used to couple RF signals from the landing pads 220 that are coupled (by bond wires 160) to the RF output terminal 154-2 of the semiconductor die 150 to an external circuit (not shown). The input and output RF transmission lines 250, 260 may be implemented as microstrip transmission lines. Additionally, a plurality of bias voltage lines 270 are provided that connect to the landing pads 220 that are coupled (by bond wires 160) to the bias voltage terminals 154-3 of the semiconductor die 150. Various passive elements such as capacitors may be coupled to the bias voltage lines 270.

Figure 6A:
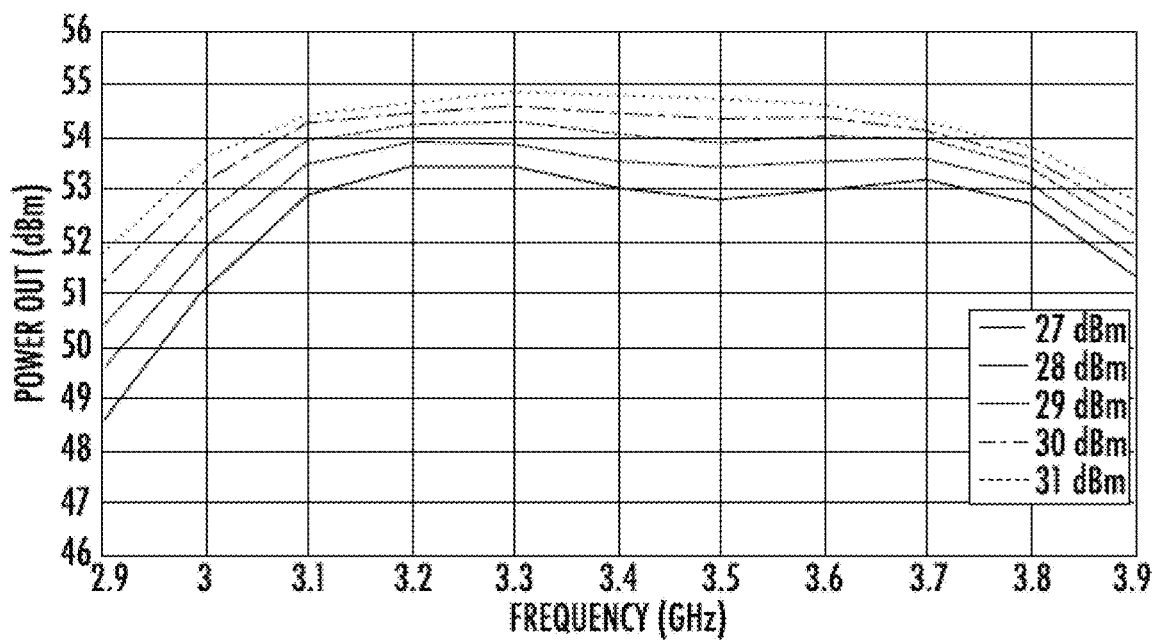
FIG. 6A is a graph of output power versus frequency for five different input power levels for the packaged RF transistor amplifier of FIGS. 2A-2B.
Figure 6B:
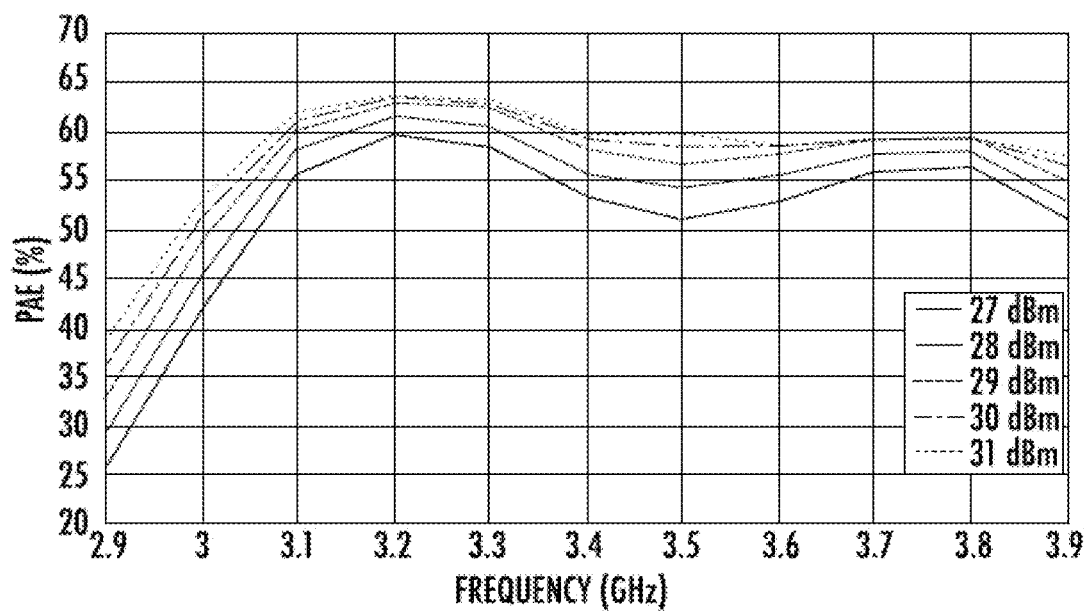
FIG. 6B is a graph of power added efficiency versus frequency for five different input power levels for the packaged RF transistor amplifier of FIGS. 2A-2B.

FIGS. 6A and 6B are graphs illustrating the measured performance of the packaged RF transistor amplifier 100. In particular, FIG. 6A is a graph of output power versus frequency for five different input power levels for the packaged RF transistor amplifier of FIGS. 2A-2B, and FIG. 6B is a graph of power added efficiency ("PAE") versus frequency for five different input power levels for the packaged RF transistor amplifier of FIGS. 2A-2B.

As shown in FIG. 6A, the packaged RF transistor amplifier 100 has an output power (at room temperature) of about 54 dBm (250 Watts) or more for input RF power levels of 29 dBm or more across the 3.1-3.5 GHz operating frequency band of amplifier 100. This corresponds to an output power density of more than 3.9 Watts/mm$^2$ given the package dimensions of 8 mm×8 mm (64 mm$^2$). The packaged RF transistor amplifier 100 has an output power of about 53 dBm or more for input RF power levels of 27 dBm or more across the operating frequency band. As shown in FIG. 6B, the packaged RF transistor amplifier 100 has a power added efficiency of at least 50% for all input RF power levels tested across the 3.1-3.5 GHz operating frequency band. These output power densities were achieved at room temperature (25° C.) operation with the RF transistor amplifier operating at a duty cycle of 20%, and a 300 microsecond pulse width. between 15% and 30% or between 15% and 25%.

Figure 7A:
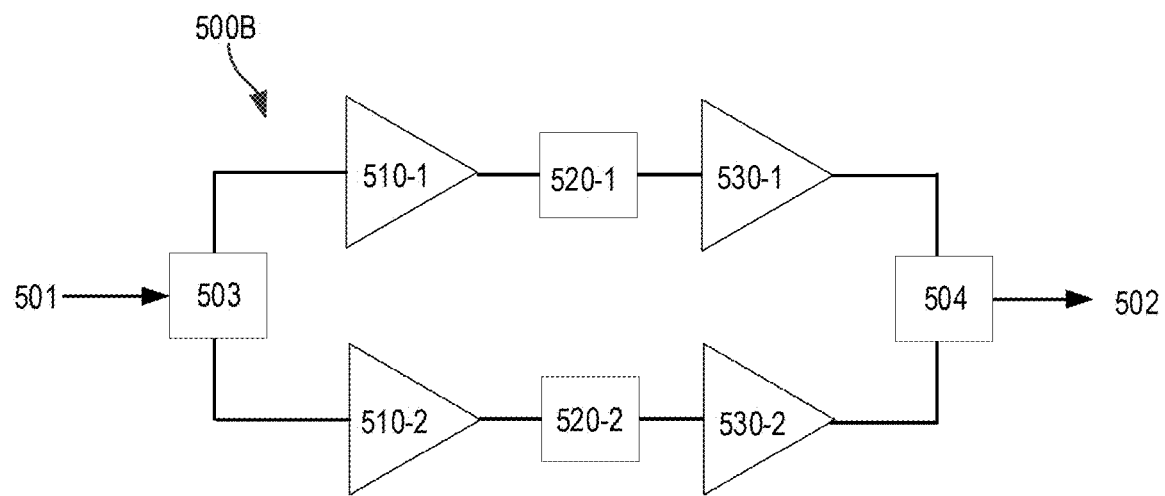
FIGS. 7A and 7B are schematic block diagrams of other example multi-amplifier circuits that may be included in packaged RF transistor amplifiers according to further embodiments of the present invention.
Figure 7B:
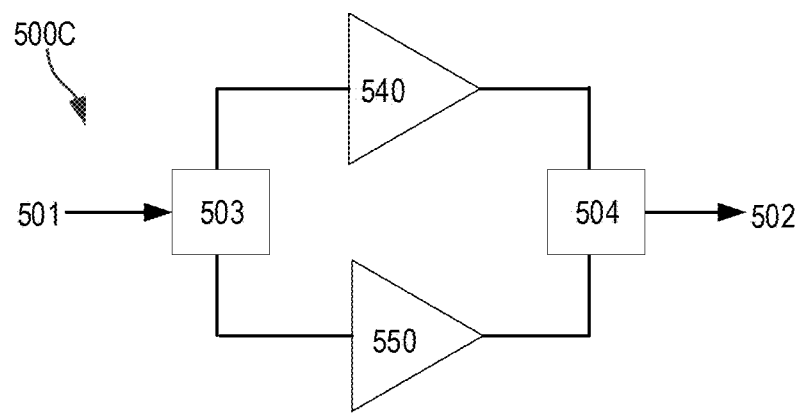

While the RF transistor amplifier described above with reference to FIGS. 2A-5 is a two-stage amplifier that includes a pre-amplification stage amplifier and a main stage amplifier, it will be appreciated that embodiments of the present invention are not limited thereto. FIGS. 7A and 7B schematically illustrate high power, high frequency RF transistor amplifier die that have other topologies that may be packaged in flat no-lead overmold packages according to embodiments of the present invention.

Referring to FIG. 7A, an RF transistor amplifier 500A is schematically illustrated that includes an RF input 501, a pair of pre-amplifiers 510-1, 510-2, a pair of interstage impedance matching networks 520-1, 520-2, a pair of main amplifiers 530-1, 530-2, and an RF output 502. A splitter 503 and a combiner 504 are also provided. Pre-amplifier 510-1 and main amplifier 530-1 (which are electrically connected in series) are arranged electrically in parallel with pre-amplifier 510-2 and main amplifier 530-2 (which are electrically connected in series). RF transistor amplifier 500A may further include an input matching network (not shown) that is interposed between RF input 501 and pre-amplifiers 510-1, 510-2, and/or an output matching network (not shown) t that is interposed between the main amplifiers 530-1, 530-2 and the RF output 502.

As shown in FIG. 7B, the packaged RF transistor amplifiers according to embodiments of the present invention may also have a Doherty configuration. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a. Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 7B, the Doherty RF transistor amplifier 500B includes an RF input 501, an input splitter 503, a main amplifier 540, a peaking amplifier 550, an output combiner 504 and an RF output 502. The Doherty RF transistor amplifier 500B may optionally include input matching networks and/or an output matching network (not shown). The main amplifier 540 and/or the peaking amplifier 550 may be implemented using any of the above-described RF transistor amplifiers according to embodiments of the present invention.

The packaged RF transistor amplifiers according to embodiments of the present invention may be very small and relatively inexpensive to manufacture while still supporting high output power and high frequency operation. The devices may allow a single packaged RF transistor amplifier to be used that is packaged in a flat no-lead overmold package while still meeting the required output power needs, simplifying the design of the RF printed circuit board and requiring less space and less external heat sinking.

The packaged RF transistor amplifiers according to embodiments of the present invention may support high output power, high frequency operation in a near chip-scale package that can easily be mounted to a customer printed circuit board. By supporting high output powers, including output powers of 250 Watts or more, it is possible to avoid any need to mount multiple circuits in parallel, which may reduce the required amount of room on the customer printed circuit board by a factor of two or more, and which also simplifies fabrication (since only a single packaged RF transistor amplifier needs to be mounted on the customer printed circuit board).

The RF transistor amplifiers according to embodiments of the present invention may be designed to operate in a wide variety of different frequency bands. In some embodiments, these RF transistor amplifier dies may be configured to operate at frequencies greater than 2.5 GHz. In still other embodiments, the RF transistor amplifier dies may be configured to operate at frequencies greater than 3.1 GHz. In yet additional embodiments, these RF transistor amplifier dies may be configured to operate at frequencies greater than 5 GHz. In some embodiments, these RF transistor amplifier dies may be configured to operate in at least one of the 2.5-2.7 GHz, 3.4-4.2 GHz, 5.1-5.8 GHz frequency bands or sub-portions thereof.

While an embodiment of the present invention is discussed above in which a MMIC RF transistor amplifier die is packaged in a flat no-lead overmold package, it will be appreciated that embodiments of the present invention are not limited thereto. For example, in other embodiments, the semiconductor die may simply comprise a single stage RF transistor amplifier. In such embodiments, any necessary matching circuits may be implemented on the customer printed circuit board and/or on additional "chips" mounted on the customer printed circuit board such as integrated passive devices. In such embodiments, the single stage RF transistor amplifier may be used as a standalone device or may be electrically coupled in series and/or in parallel with additional RF transistor amplifiers to provide a wide variety of different amplifier configurations. Non-MMIC implementations may be preferred in applications where size is not a strong consideration Although embodiments of the present invention have been discussed above with respect to a RF transistor amplifier dies that are implemented using HEMT devices, it will be understood that other types of semiconductor devices may be formed in the semiconductor layer structure without deviating from the present invention. For example, the semiconductor layer structure may include a MOSFET, a DMOS transistor, a MESFET, and/or an LDMOS transistor in other embodiments.

Embodiments of the present inventive concepts have been described above with reference to the accompanying drawings, in which embodiments of the invention are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

In the specification and the figures, two-part reference numbers (i.e., two numbers separated by a dash) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A packaged radio frequency ("RF") transistor amplifier, comprising:
   a flat no-lead overmold package that includes a die pad, a plurality of terminal pads and an overmold encapsulation that at least partially covers the die pad and the terminal pads; and
   an RF transistor amplifier die mounted on the die pad and at least partially covered by the overmold encapsulation,
   wherein the RF transistor amplifier die includes at least one RF transistor amplifier circuit that comprises a gate-drain-gate spacing of less than 45 microns.

2. The RF transistor amplifier of claim 1, wherein an output power density rating of the packaged RF transistor amplifier is between 3.0 W/mm$^2$ and 5.5 W/mm$^2$.

3. The RF transistor amplifier of claim 1, wherein the RF transistor amplifier die is a monolithic microwave integrated circuit ("MMIC") RF transistor amplifier die.

4. The RF transistor amplifier of claim 3, wherein the MMIC RF transistor amplifier die includes a first stage RF transistor amplifier and a second stage RF transistor amplifier that are electrically connected in series.

5. The RF transistor amplifier of claim 4, wherein the MMIC RF transistor amplifier die further includes an input matching network that is coupled between an RF input of the MMIC RF transistor amplifier die and the first stage RF transistor amplifier, an interstage matching network that is coupled between the first stage RF transistor amplifier and the second stage RF transistor amplifier, and an output matching network that is coupled between the second stage RF transistor amplifier and an output of the MMIC RF transistor amplifier die.

6. A packaged radio frequency ("RF") transistor amplifier, comprising:
   a flat no-lead package that includes a die pad, a plurality of terminal pads and an overmold encapsulation that at least partially covers the die pad and the terminal pads; and
   a monolithic microwave integrated circuit ("MMIC") RF transistor amplifier die mounted on the die pad and at least partially covered by the overmold encapsulation,
   wherein a surface area of the flat no lead package is less than 80 mm$^2$ and an output power of the packaged RF transistor amplifier is at least 200 Watts.

7. The RF transistor amplifier of claim 6, wherein the MMIC RF transistor amplifier die is configured to amplify RF signals having frequencies in a 3.1-3.5 GHz frequency band.

8. A packaged radio frequency ("RF") transistor amplifier, comprising:
   a flat no-lead package that includes a die pad, a plurality of terminal pads and an overmold encapsulation that at least partially covers the die pad and the terminal pads; and
   an RF transistor amplifier die mounted on the die pad, wherein an upper surface and side surfaces of the RF transistor amplifier die are covered by the overmold encapsulation, wherein the RF transistor amplifier die includes at least one RF transistor amplifier circuit having a gate-drain-gate spacing of less than 45 microns, and wherein an output power density rating of the packaged RF transistor amplifier is at least 3.5 W/mm$^2$.

9. The RF transistor amplifier of claim 8, wherein an operating frequency of the packaged RF transistor amplifier is greater than 2.5 GHz.

10. The RF transistor amplifier of claim 9, wherein the output power density rating of the packaged RF transistor amplifier is between 3.5 W/mm$^2$ and 5.0 W/mm$^2$.

11. The RF transistor amplifier of claim 10, wherein the RF transistor amplifier die includes a first stage RF transistor amplifier and a second stage RF transistor amplifier that are electrically connected in series.

12. The RF transistor amplifier of claim 11, wherein the RF transistor amplifier die further includes an input matching network that is coupled between an RF input of the RF transistor amplifier die and the first stage RF transistor amplifier, an interstage matching network that is coupled between the first stage RF transistor amplifier and the second stage RF transistor amplifier, and an output matching network that is coupled between the second stage RF transistor amplifier and an output of the RF transistor amplifier die.

13. The RF transistor amplifier of claim 8 in combination with a printed circuit board that includes a die attach pad and a plurality of landing pads, wherein the die pad is attached to the die attach pad and the terminal pads are attached to respective ones of the landing pads.

14. The RF transistor amplifier of claim 13, wherein the printed circuit board further includes an array of conductive vias that are underneath the die attach pad.

15. The RF transistor amplifier of claim 2, wherein the output power density rating of between 3.5 W/mm$^2$ and 5.0 W/mm$^2$ is achieved with the RF transistor amplifier operating at a duty cycle of at least 15%.

16. The RF transistor amplifier of claim 15, wherein the output power density rating of between 3.5 W/mm$^2$ and 5.0 W/mm$^2$ is achieved with the RF transistor amplifier operating at a duty cycle of between 10% and 50%.

17. The RF transistor amplifier of claim 16, wherein the output power density rating of between 3.5 W/mm$^2$ and 5.0 W/mm$^2$ is achieved with the RF transistor amplifier operating at a pulse width of between 100 and 500 microseconds.

18. The RF transistor amplifier of claim 6, wherein an output power of the packaged RF transistor amplifier is at least 200 Watts when the RF transistor amplifier operating at a duty cycle of at least 15%.

19. The RF transistor amplifier of claim 18, wherein the output power of at least 200 Watts is achieved with the RF transistor amplifier operating at a duty cycle of between 10% and 50%.

20. The RF transistor amplifier of claim 8, wherein the output power density rating of at least 3.5 W/mm$^2$ is achieved with the RF transistor amplifier operating at a duty cycle of at least 15%.

21. The RF transistor amplifier of claim 20, wherein the output power density rating of at least 3.5 W/mm$^2$ is achieved with the RF transistor amplifier operating at a duty cycle of between 10% and 50%.

22. The packaged RF transistor amplifier of claim 6, wherein the MMIC RF transistor amplifier die includes at least one RF transistor amplifier circuit that comprises a gate-drain-gate spacing of less than 45 microns.

* * * * *